(12) United States Patent
Chen et al.

(10) Patent No.: US 8,090,916 B2
(45) Date of Patent: *Jan. 3, 2012

(54) IN-CIRCUIT PROGRAMMING ARCHITECTURE WITH PROCESSOR AND DELEGABLE FLASH CONTROLLER

(75) Inventors: William Chen, Hsinchu (TW); Jeon-Yung Ray, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 1336 days.

This patent is subject to a terminal disclaimer.

(21) Appl. No.: 10/881,057

(22) Filed: Jun. 29, 2004

(65) Prior Publication Data

US 2005/0289290 A1   Dec. 29, 2005

(51) Int. Cl.
*G06F 12/00* (2006.01)
*G06F 13/00* (2006.01)
*G06F 13/28* (2006.01)

(52) U.S. Cl. ................................................. 711/154
(58) Field of Classification Search ................ 711/103
See application file for complete search history.

(56) References Cited

U.S. PATENT DOCUMENTS

| | | | |
|---|---|---|---|
| 5,276,839 A * | 1/1994 | Robb et al. | 711/103 |
| 5,485,624 A * | 1/1996 | Steinmetz et al. | 712/34 |
| 5,901,330 A | 5/1999 | Sun et al. | 395/828 |
| 5,923,838 A * | 7/1999 | Hongo | 714/42 |
| 6,141,700 A * | 10/2000 | Iwata | 710/3 |
| 6,151,657 A | 11/2000 | Sun et al. | 711/103 |
| 6,301,656 B1 * | 10/2001 | Streett et al. | 713/2 |
| 6,751,155 B2 * | 6/2004 | Gorobets | 365/230.09 |
| 6,766,408 B2 * | 7/2004 | Nasu | 711/103 |
| 2005/0120146 A1 * | 6/2005 | Chen et al. | 710/22 |

FOREIGN PATENT DOCUMENTS

CN   1150453 C   5/2004

* cited by examiner

*Primary Examiner* — Kevin Ellis
*Assistant Examiner* — Gary W Cygiel
(74) *Attorney, Agent, or Firm* — Stout, Uxa, Buyan & Mullins, LLP

(57) ABSTRACT

An architecture for an integrated circuit with in-circuit programming allows real-time modification of the in-circuit programming code and other code stored on the chip. The architecture utilizes a microprocessor and control logic on an integrated circuit having a single non-volatile memory that stores instructions and data, such as in-circuit programming and user code, and input/output ports and related structure for exchanging data with an external device. Using in-circuit programming code stored on the chip, the chip interactively establishes an in-circuit programming exchange with an external device to update data and instructions including the in-circuit programming code. Input/output conflicts during in-circuit programming can be avoided by employing a memory controller to handle at least part of the in-circuit programming operations. The memory controller allows the in-circuit programming code to be updated in real time.

26 Claims, 7 Drawing Sheets

IN-CIRCUIT PROGRAMMING ARCHITECTURE WITH PROCESSOR AND DELEGABLE FLASH CONTROLLER

BACKGROUND OF THE INVENTION

1. Field of the Invention

The present invention relates to programming of integrated circuits and, more particularly, to architectures and methods for in-circuit programming (ICP) with processors and flash memory semiconductor devices.

2. Description of Related Art

In-circuit programming (ICP) integrated-circuit structures of the prior art have generally relied upon combinations of mask read only memory (ROM) modules and/or flash memory modules under the direct control of a microprocessor. An ICP structure using both a mask read only memory module and a flash memory module, as disclosed in U.S. Pat. No. 5,901,330 the entire contents of which are incorporated herein by reference, requires a die size large enough of course to contain both the mask read only memory module and the flash memory module. Moreover, as a result of such a programming structure utilizing the mask read only memory to store information such as portions of ICP code, this programming structure can be relatively inflexible for facilitating updating the ICP code.

Other ICP structures, such as disclosed in U.S. Pat. No. 6,151,657 the entire contents of which are incorporated herein by reference, harness a pair of flash memory modules or banks, thus requiring a relatively large die size once again to accommodate the multiple flash memory modules. In the configuration of this patent, both of the flash memory modules are apparently needed for implementing the ICP code update.

Both of the aforementioned architecture types thus employ multiple components and may very well implement programming during manufacturing of the devices which cannot be readily or efficiently updated. Another deficiency in these two types of ICP architectures can be a relatively heavy reliance on a microprocessor for ICP code updating that can for example tax the resources of the microprocessor. A need thus exists in the prior-art for an ICP architecture which can reduce costs by conserving for example die space, and which can improve reliability, efficiency and flexibility.

SUMMARY OF THE INVENTION

The present invention addresses these needs by providing an ICP integrated-circuit architecture which utilizes a single non-volatile memory device, such as a flash memory device; a microprocessor; and a simple logic memory controller coupled between the single non-volatile memory device and the microprocessor. Both ICP code and user code are contained in this single non-volatile memory device, and both can be updated by the ICP architecture without another specific memory hardware device.

Eliminating other memories may also improve reliability and decrease power consumption. Cost and wafer die size may also be reduced. By reducing or eliminating the amount of mask read only memory (ROM) required by an integrated circuit design, for example, the present invention may permit a device to be manufactured before the ICP code is defined, decreasing time to market since the final code does not have to be programmed at the time of manufacture. Since, in accordance with an aspect of the present invention, all data is stored in reprogrammable non-volatile memory, updates may occur either on the fly in the field after deployment or normally in the factory at the time of initial production. This ability to provide real-time code updates in the field may reduce device obsolescence by eliminating an impact of hardware changes.

In accordance with another aspect of the invention, benefits can be obtained by reducing a number of high voltage pumping circuits, sense amplifiers, and input/output (I/O) ports through utilization of a single flash memory device for all ICP code and user code. The present invention also may avoid I/O conflicts during ICP code erase/program functions by employing a memory controller as a controlling means to handle at least a portion of this operation.

In accordance with yet another aspect of the invention, the port through which the integrated circuit communicates with external devices may be selected from a plurality of ports on the integrated circuit.

The present invention can comprise a single integrated circuit that may serve any function for which a microprocessor is suitable. For example, it may be a device controller for a numerically controlled (NC) machine; an interface device that accepts data from an external device, processes it and passes it on to another device; or a protocol device that takes data in one format and passes it on in another format. An illustrative, non-exhaustive, list of specific examples of typical applications and devices includes: liquid crystal display (LCD) monitors; Bluetooth™ devices; global positioning systems (GPS); cellular phones; personal digital assistants (PDAs); digital cameras; digital music players; messaging; web access; digital video disk (DVD) players; hard disk drives; graphics cards; printers; wireless local area networks (LANs); and set top boxes.

According to an aspect of the invention, a method of in-circuit programming comprises the steps of storing, receiving, forwarding, buffering, and accessing sets of instructions. A set of user code or ICP instructions is stored in the single flash memory device. The ICP set of instructions includes erase/program command handler code to operate the delegable flash memory controller and communicate with the initiator. The ICP code takes charge of communication with external initiator via an external I/O port. It obtains information such as ICP modification parameters: the block the initiator wants to erase or program, the address byte, and the data the initiator may want to program. In addition, ICP code also controls communication with the delegable flash memory controller via a control register. It forwards the erase/program information received from the initiator to the delegable flash memory controller by forwarding erase/program commands to the control register where it is buffered. The microprocessor is idled, the code is executed by the delegable flash memory controller, and the microprocessor is reactivated.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the figures, detailed description, and claims that follow.

DETAILED DESCRIPTION OF THE PRESENTLY PREFERRED EMBODIMENTS

Figure 1:
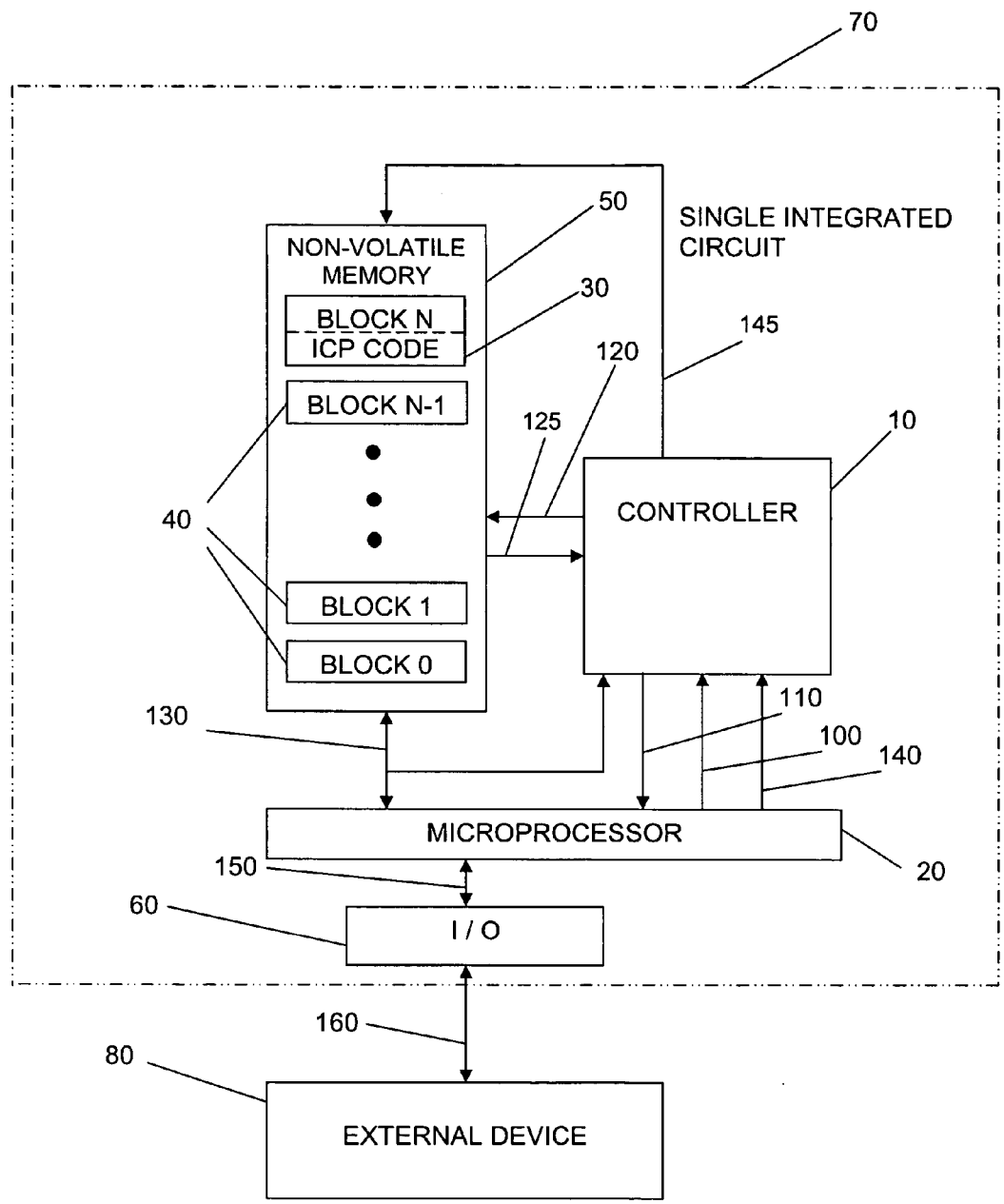
FIG. 1 is a general schematic block diagram of an ICP architecture including a discrete input/output (I/O) communication port in accordance with an aspect of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form.

Although the disclosure herein refers to certain illustrated embodiments, it is to be understood that these embodiments are presented by way of example and not by way of limitation. The intent of the following detailed description, although discussing exemplary embodiments, is to cover all modifications, alternatives, and equivalents as may fall within the spirit and scope of the invention as defined by the appended claims. It is to be understood and appreciated that the structures and method steps described herein do not cover a complete detailed design for the manufacture of ICP devices. The present invention may be practiced in conjunction with various integrated circuit design and coding techniques that are conventionally used in the art, and only so much of the commonly practiced design details are included herein as are necessary to provide an understanding of the present invention.

The terms used in the detailed description are as generally used in the art. Specific definitions and drawing conventions are included to ensure the clarity of the specification but are not intended to be inclusive.

In the drawing figures, while not being limited, a line without arrows simply means a connection, whereas lines with arrows mean a flow of information in the direction of the arrow or arrows. Dashed lines indicate flash memory areas in a preferred embodiment.

Figure 2:
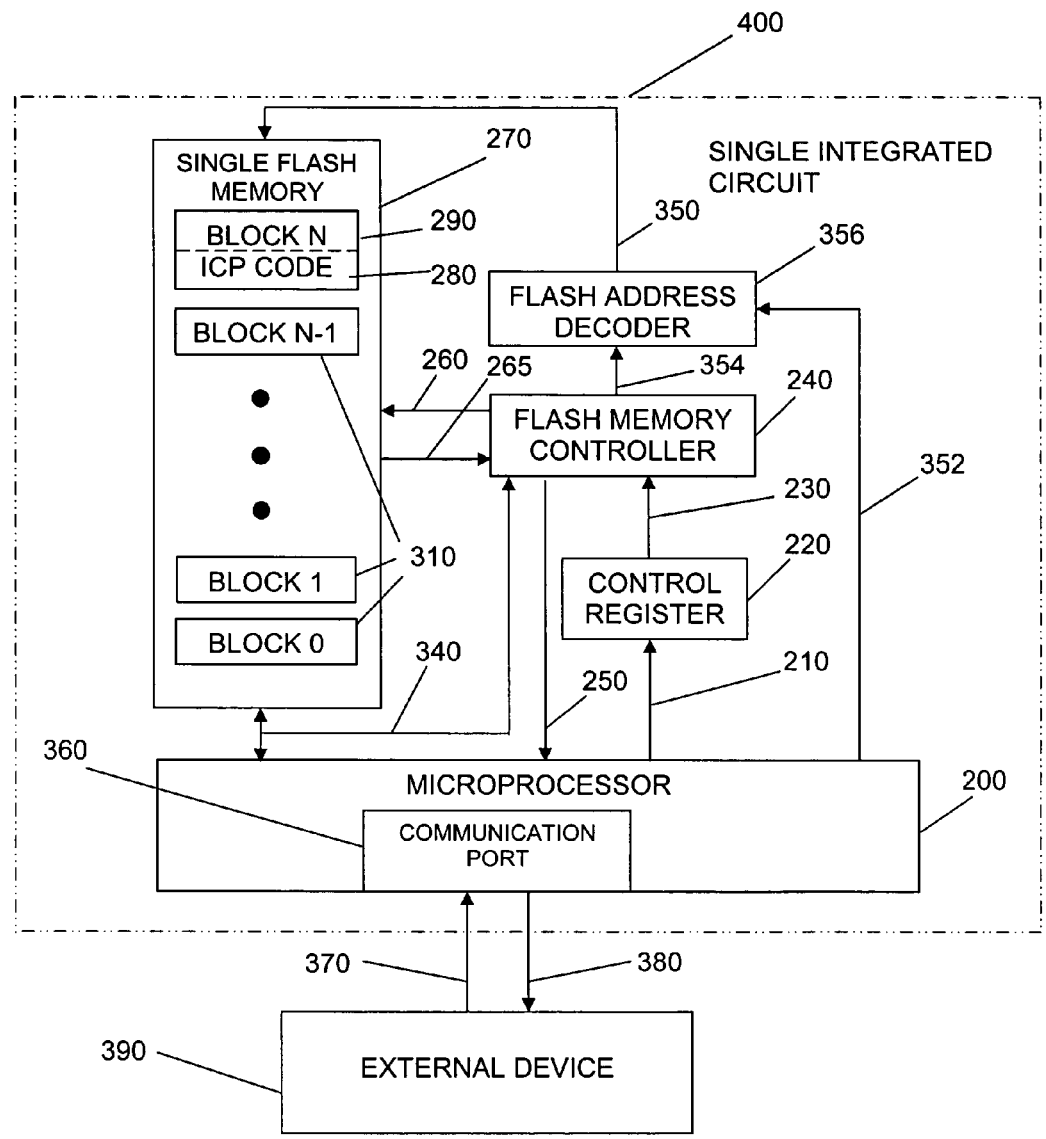
FIG. 2 is a schematic block diagram of an ICP architecture including a delegable flash memory controller, flash memory address decoder, and control register in accordance with a preferred embodiment of the present invention.
Figure 3:
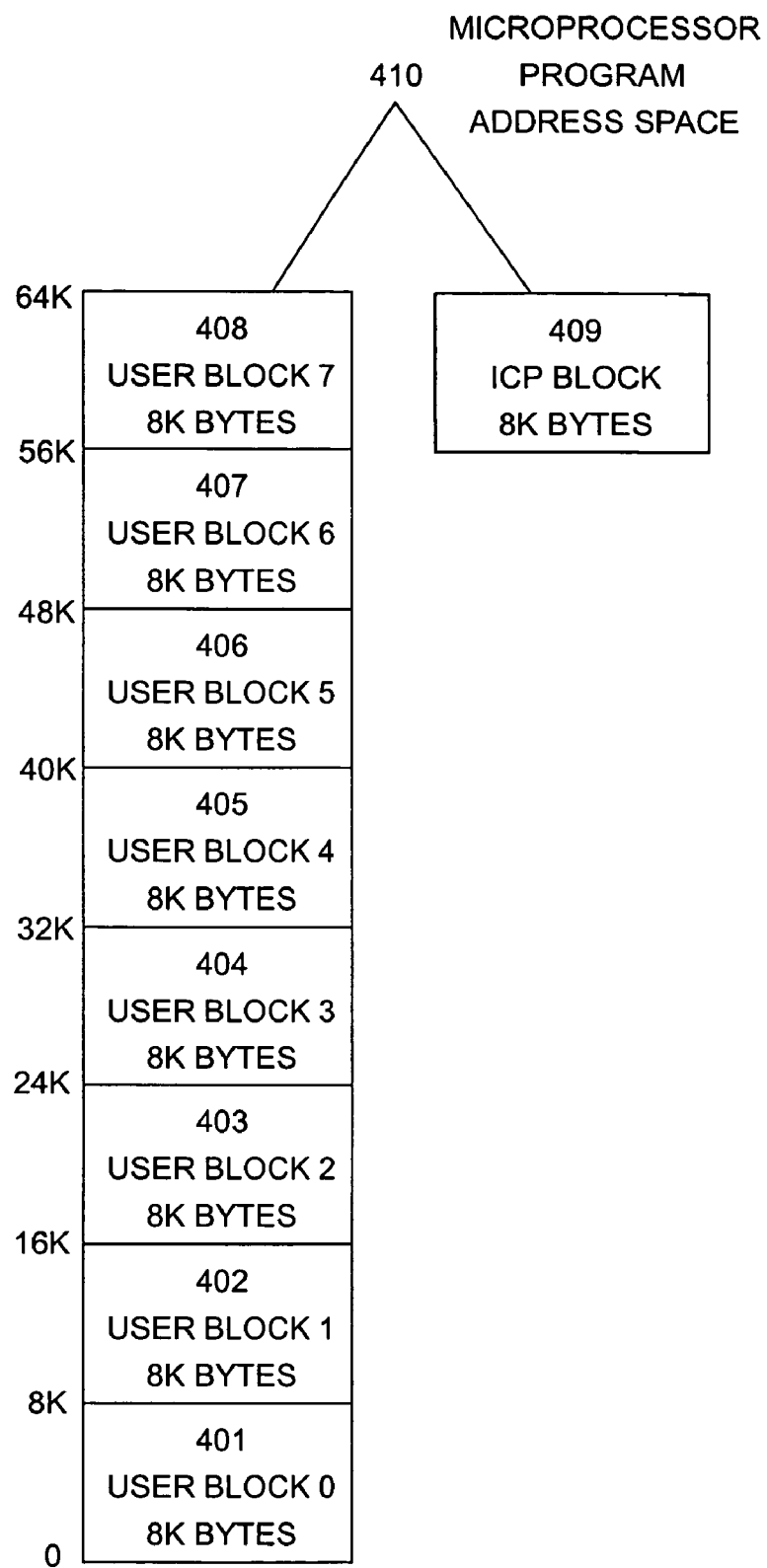
FIG. 3 is a diagram of the microprocessor address space in accordance with an aspect of the present invention.
Figure 4:
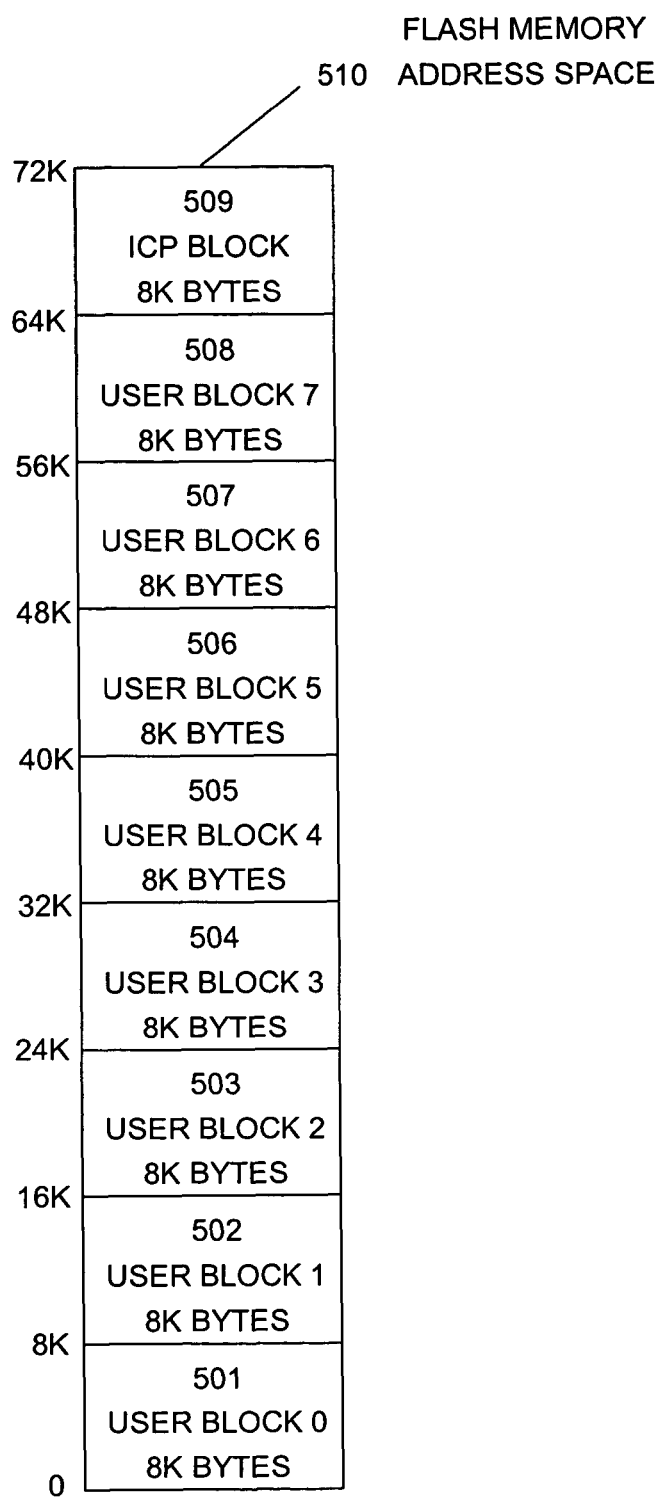
FIG. 4 is a diagram of the flash memory address space in accordance with an aspect of the present invention.
Figure 5:
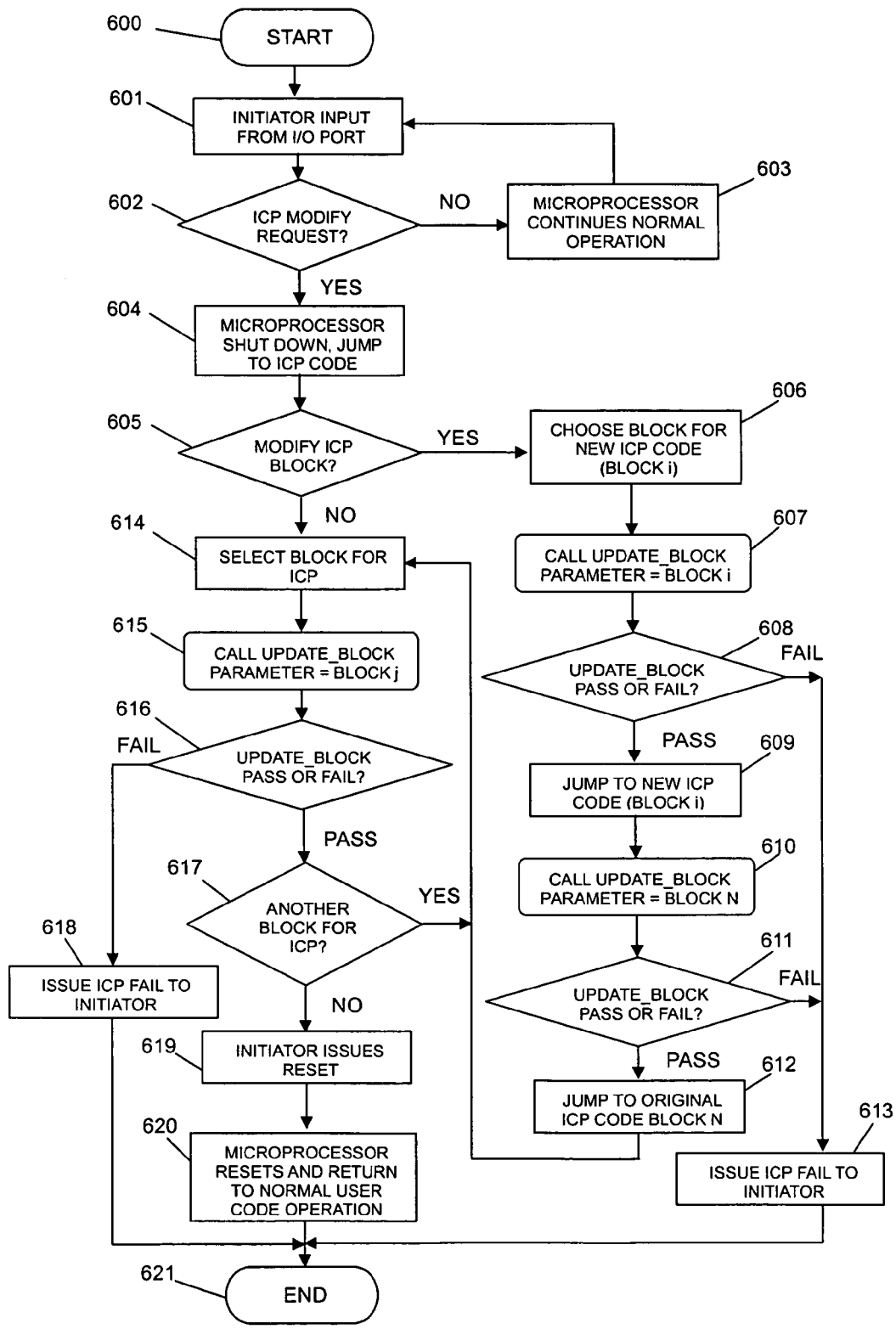
FIG. 5 is a flow chart of an ICP modify operation, according to the present invention.
Figure 6A:
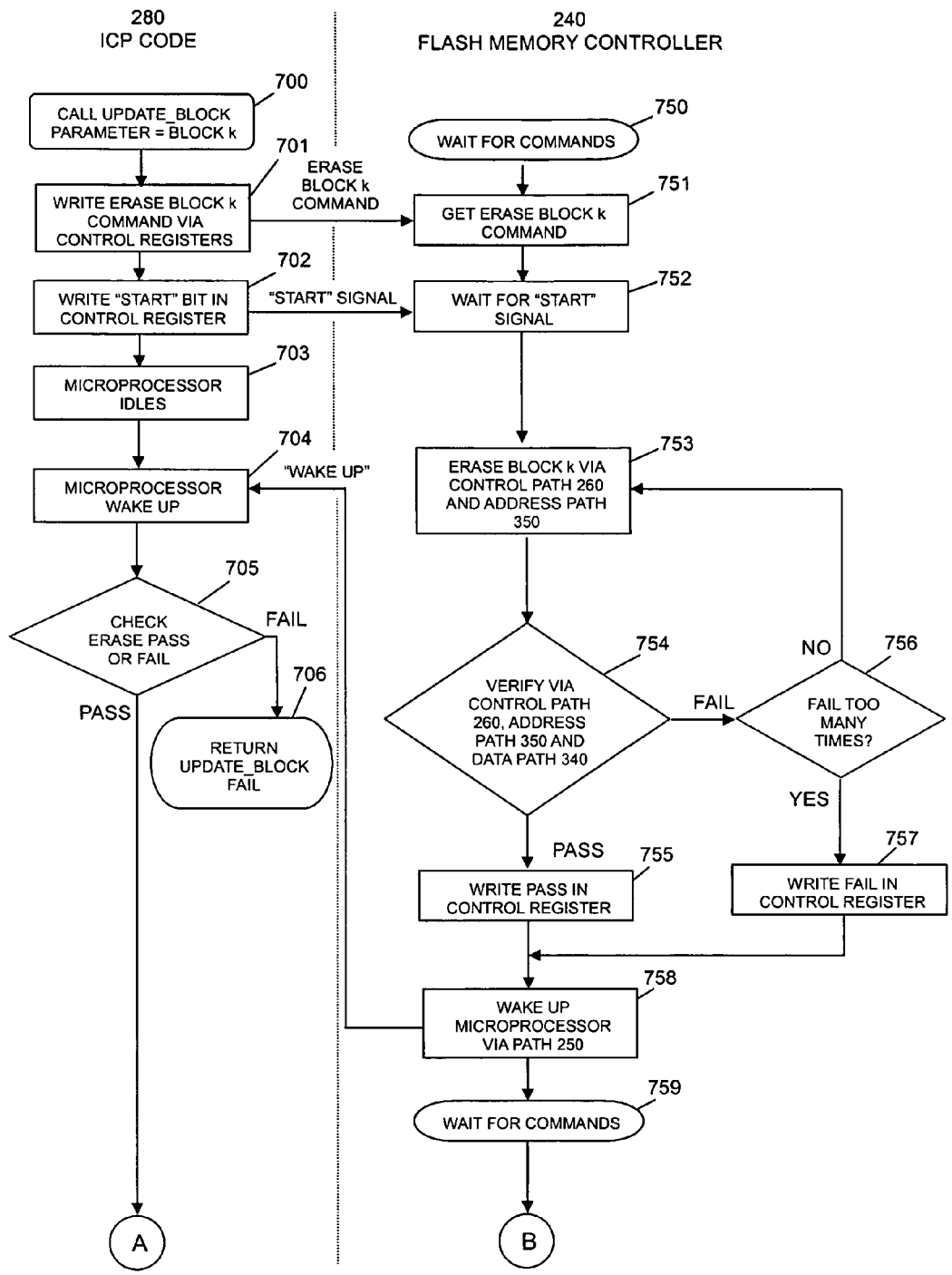
FIG. 6A is a flow chart of the delegable flash memory controller code erase operation which is called from FIG. 5.
Figure 6B:
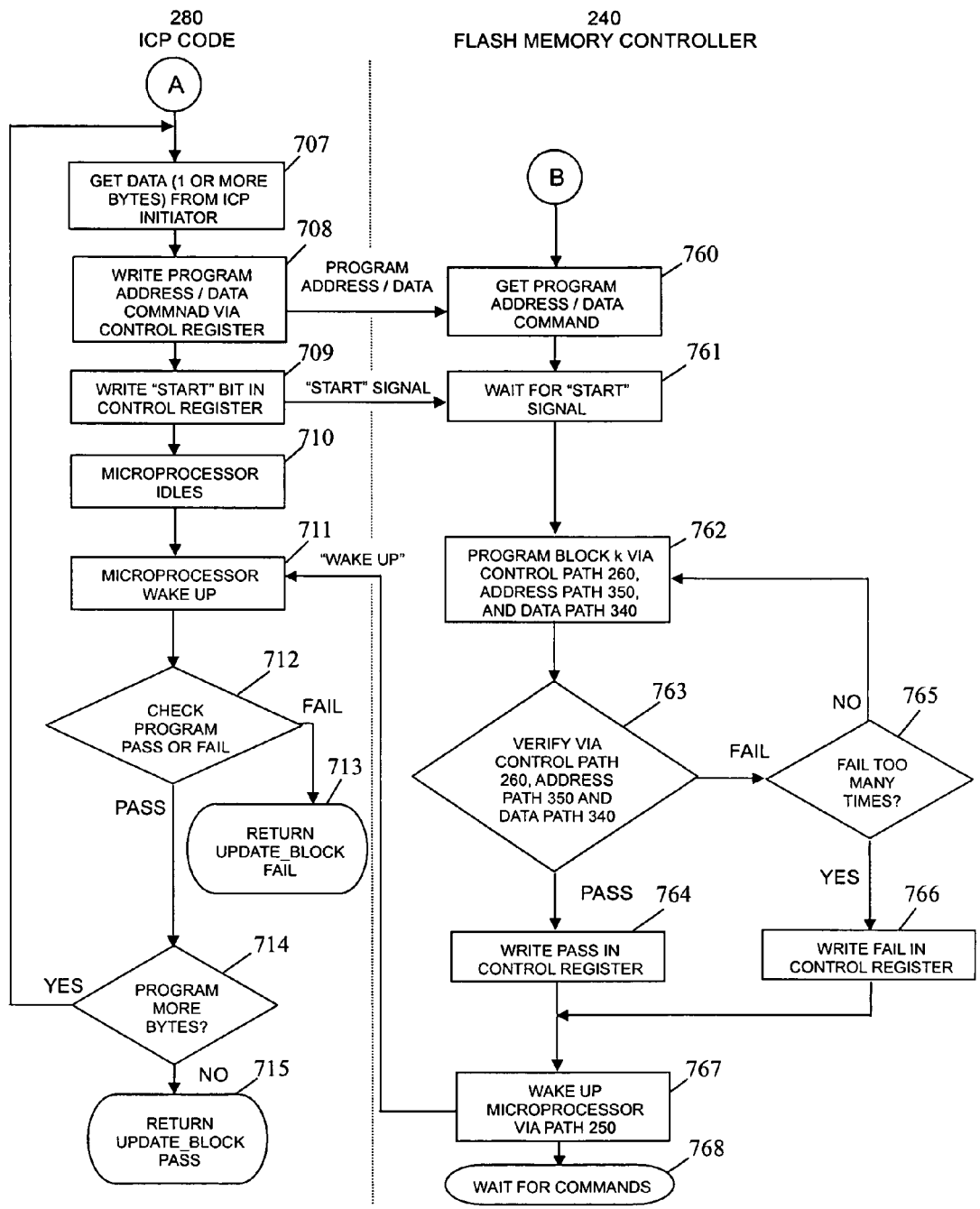
FIG. 6B is a flow chart of the delegable flash memory controller code program operation which is called from FIG. 5.

Referring more particularly to the drawings, FIG. 1 and FIG. 2 elucidate architectures of systems for in-circuit programming in accordance with aspects of the present invention. FIG. 3 and FIG. 4 represent the microprocessor address space and flash memory space respectively in accordance with aspects of the present invention. FIGS. 5, 6A, and 6B are flowcharts depicting one embodiment of a number of steps involved in updating code contained in ICP memory according to an illustrated embodiment of the present invention. As used herein, the term code means one or more instructions or data implemented in the operation of a device.

FIG. 1 is a general schematic block diagram of an architecture according to the present invention for a single integrated circuit 70 supporting ICP. The architecture of the single integrated circuit 70 includes a microprocessor 20 that may execute a program of instructions and a communication means implemented in the illustrated embodiment as a distinct I/O communication port 60 for receiving digital data from and transmitting digital data to an external device 80. Digital data can include computer instructions, numerical values, alphanumeric symbols, or any other information that is digitally encoded in binary or other digital format. In this context, the term port refers to an interface to a component or device that supports a one-way or bidirectional exchange of data.

The term communication means may refer to one, several, or any combination of ports either fixed in function or with the function controlled by, for example, the code in the memory, and includes but is not limited to interfaces such as those supporting the Bluetooth™ standard, Infrared Data Association (IrDA) standard, cable, Intel/Microsoft/Digital standard Universal Serial Bus (USB), the Philips Electronics/Computer Access Technology standard Access Bus, the Apple Computer/IBM/AT&T standard Geoport, the Apple Computer/Texas Instruments/NCR standard 1349 FireWire, the Internet, a serial port (such as RS232), or a parallel port.

The I/O communication port 60 is connected to an external device 80 via a data path 160. The external device 80 can be any device that receives or transmits digital data, such as a machine under control, a network, another input/output device, a data translator or interface, or a protocol translator, and it may be a device that causes the ICP code or user code to be modified.

The integrated circuit 70 further includes a single non-volatile memory 50 comprising non-volatile memory cells on the integrated circuit 70 and a memory controlling means shown as a delegable memory controller 10. As used herein, the term delegable memory controller refers to a controller to which program and erase tasks may be delegated. For example, the term can refer to a flash memory controller that is delegated to do program and erase tasks. In one embodiment, the flash memory controller is a finite-state machine which implements flash program, erase and verify tasks. In the illustrated embodiment, the memory controlling means is a simple logic controller that is specialized for the purpose of updating ICP code and/or user code within the non-volatile memory 50, thereby eliminating a need for a second memory and/or freeing resources of and attenuating a prolonged operation of the microprocessor 20.

The non-volatile memory 50 may store and send instructions for execution to the microprocessor 20 via a data path 130. As used herein, the term non-volatile memory may include non-volatile memory formed for example of electrically erasable programmable memory cells or formed by floating gate memory cells, also referred to as flash memory. The microprocessor 20 interfaces with the non-volatile memory 50 via an instruction address path 130. The microprocessor 20 instruction path 140 interfaces with the delegable memory controller 10. The delegable memory controller 10 decodes the address and the sends it to the non-volatile memory 50 via path 145.

As will be shown in more detail with reference to FIG. 3, the microprocessor address space is from 0~64K, address 0x0000~0xFFFF. As shown in FIG. 4, a non-volatile memory 50 address space is from 0~68K, where 64K~68K comprises a block of ICP code 30. In normal user code operation, the microprocessor's address will be decoded to the 0K~64K user block. While in ICP mode operation, when the microprocessor issues an address between 60K~64K, 0xE000~0xFFFF, the delegable memory controller 10 will decode it to 64K~68K, 0x10000~0x1FFFF and the ICP code 30 will be executed. In addition, when erase/program tasks are being implemented by the delegable flash memory controller 10, the address path 145 is also controlled by the delegable memory controller 10 to send the erase/program address to the nonvolatile memory 50.

The non-volatile memory 50 comprises 0 through N−1 user code blocks 40, and block N comprises the ICP code 30. As used herein, the term ICP code block refers to a portion of memory comprising code that contains a set of instructions used to program a microprocessor. The ICP code block 30 contains all of the ICP codes inclusive of communicating with the initiator and sends commands to the delegable memory controller 10 to perform read/erase/program/verify tasks; this includes the erase/program command handler code. Additionally, as used herein, the term user code block or blocks refers to a portion of memory that contains a set of instructions used to control or communicate with a microprocessor or an external device. User code blocks 0 through block N−1 are utilized by the user of this single integrated circuit 70 to program/provide the code for a specific application and for facilitating communication with the external device 80. Instructions within the user code blocks 40 may also contain "null code" which is no code at all.

In accordance with a feature of the present invention, the microprocessor 20 enables (or delegates to) the delegable memory controller 10 tasks such as, in particular, responding to an in-circuit program update command (i.e., a modification instruction) which may erase and/or write non-volatile memory cells of the non-volatile memory 50 through path 120. The delegable memory controller 10, in turn, sends data to the microprocessor 20 by path 110 and receives signals from the non-volatile memory 50 by path 125. The microprocessor 20 exchanges data with the I/O communication port 60 by a path 150 and sends data to the delegable memory controller 10 by path 100.

FIG. 2 is a schematic block diagram of an ICP architecture formed on a single integrated circuit 400 in accordance with a preferred embodiment of the present invention. The ICP architecture includes a microprocessor 200, which may execute a program of instructions and which includes a communication port 360 that receives digital data from an external device by input path 370 and transmits digital data to an external device 390 via data path 380. The microprocessor 200 also includes communication paths (not shown) for interrupts and other signals generally used to coordinate and synchronize communications through, for example, the communication port 360 as known to those skilled in the art. The microprocessor 200 is operatively coupled to, and is configured to delegate ICP operations to and receive notifications from, a control register 220 and a delegable flash memory controller 240 via data paths 210 and 250, respectively. As mentioned above, the term delegable is intended to mean capable of being assigned to perform memory control operations when used in the context of the delegable memory controller.

Furthermore, the ICP architecture includes a single flash memory device 270, which is coupled between the microprocessor 200 and the delegable flash memory controller 240 and which comprises non-volatile memory cells on the integrated circuit that may store and send instructions for execution to the microprocessor 200 via data path 340.

As presently embodied, the communication port 360 within the microprocessor 200 may include one or more input ports, output ports, or input/output ports. In comparison to the I/O communication port 60 of FIG. 1, it is noted that in some applications the discrete I/O communication port 60 of FIG. 1 may not be needed. While greater external device interface flexibility may be provided with a communication means such as the I/O communication port 60 of FIG. 1, the I/O capabilities of the communication port 360 incorporated within the microprocessor 200 may be sufficient for many relatively simple or predictable interfaces with external devices. Moreover, the configuration of FIG. 2 may consume less chip real estate and less power. However, while in the illustrated embodiment the communication port 360 is integrally formed with the microprocessor 200, other configurations may be implemented in modified embodiments such as the utilization of a communication means as defined in connection with FIG. 1 coupled to the microprocessor 200.

The delegable flash memory controller 240 and the control register 220 and the flash memory address decoder 356 of the ICP architecture of FIG. 2 correspond to the delegable memory controller 10 of FIG. 1. In the illustrated embodiment, the single flash memory device 270 comprises N blocks. Block N 290 is used for storing the ICP code 280, and other blocks 310 contain user code. As with the ICP code 30 in FIG. 1, the ICP code 280 controls the steps required to read, erase, and/or program and verify code, including, for example, the ICP code and user code. The ICP code is also used to communicate with or control an external device 390.

A data path 230 interconnects the delegable flash memory controller 240 and the control register 220. The delegable flash memory controller 240 sends a reactivation instruction or "wake up" control signal, for example, to notify the microprocessor 200 when a code modification is complete via the control path 250 and exchanges data with the single flash memory device 270 via a data path 340, and control paths 260 and 265. The delegable flash memory controller 240 is operatively connected with the flash memory address decoder 356 by address path 354 which is connected to the single flash memory device 270 by path 350. The control path 260 controls the single flash memory device 270 to perform a read, program, or erase step. The control path 265 carries the signal that the single flash memory device 270 has completed an erase/program step.

In the prior-art U.S. Pat. No. 5,901,330 and U.S. Pat. No. 6,151,657, when the microprocessor programs or erases the flash memory, the microprocessor must fetch the instruction codes (ICP codes). This requires two memory blocks in the form of either one flash memory and one ROM or two flash memories. If the ICP code or erase/program handler is located in the same flash memory which will be programmed or erased, the microprocessor can not access code from the flash memory and erase or program it at the same time without for example generating I/O conflicts. In accordance with an aspect of the present invention, the microprocessor 200 is placed into an idle mode for example by the controlling means, e.g. the delegable flash memory controller 240, during these operations. This enables the data path 340 to be used by the delegable flash memory controller 240 and single flash memory device 270 without I/O conflicts. Similarly, when the microprocessor 200 executes ICP or user code, it obtains the code via path 340. At that time, the delegable flash memory controller 240, is in the "waiting for command" or "waiting for start bit" state which leaves the data path 340 available for the microprocessor 200 and single flash memory device 270 to use without I/O conflicts.

By locating both the ICP code 280 and user code 310 within a single flash memory 270, they are able to share one set of high voltage pumping circuitry, sense amplifier circuitry, and I/O flash memory ports rather than multiple sets as would be required with multiple memory devices. As used herein, the term high voltage pumping circuitry refers to a single circuit or separate high voltage pumping and high voltage circuits. The shared I/O flash memory ports exchange data with microprocessor 200 in FIG. 2, sending data by path 340 and receiving instruction address data from the flash memory address decoder 356 via data path 350, and exchanging control signals with the delegable flash memory controller 240 in FIG. 2 via paths 260 and 265.

By communicating with the control register 220 via the data path 210, the microprocessor 200 can enable the delegable flash memory controller 240 and delegate control to the delegable flash memory controller 240 via, for example, the control register 220. As presently embodied, the control register 220 is an integrated circuit component that latches, buffers, or otherwise retains a value in memory until it is emptied.

The microprocessor 200 inputs instruction addresses via data path 352 to the flash memory address decoder 356, which decodes the addresses and sends them to the single flash memory device 270 via data path 350. The flash memory address decoder 356 will chose the correct address to let the microprocessor fetch ICP code or user code according to whether an ICP code modify request has been received or not, respectively, as also detailed in the descriptions of FIG. 1, FIG. 3, and FIG. 4.

The microprocessor receives instructions from the single flash memory device 270 via data path 340. During an ICP function, such as may be evoked by an in-circuit program update command (i.e., a modification instruction) causing the microprocessor 200 to execute instructions within the ICP code block 290, erase/program instructions from, for example, the ICP code block 290 are delegated by the microprocessor 200 to the controlling means, e.g., the delegable flash memory controller 240, control register 220, and flash memory address decoder 356, for implementation. Erase/program instructions may originate with the external device 390. The delegable flash memory controller 240 receives commands corresponding to the erase/program instructions via the control register 220, and proceeds, for example, to erase non-volatile memory cells of the single flash memory device 270 and/or program the cells with, for example, data from the external device 390. In the embodiments illustrated in FIG. 1 and FIG. 2, only a single non-volatile memory device is illustrated. Alternative embodiments may include more than one non-volatile memory device, providing, for example, additional flexibility in the design and implementation of the overall system and/or the ICP system.

FIG. 3 shows an exemplary diagram of a microprocessor program address space 410. This address space is divided into a plurality of blocks. User block 0, 401, extends from address 0 to address 8K. User block 1, 402, extends from address 8K to address 16K. User block 2, 403, extends from address 16K to address 24K. User block 3, 404, extends from address 24K to address 32K. User block 4, 405, extends from address 32K to address 40K. User block 5, 406, extends from address 40K to address 48K. User block 6, 407, extends from address 48K to address 56K. User block 7, 408, extends from address 56K to address 64K. ICP block, 409, extends from address 56K to address 64K.

Taking an 8051 microprocessor, for example, its address space is from 0 to 64K (0000h~FFFFh). When the microprocessor is in ICP mode, the address 56K~64K (E000h~FFFFh) will be decoded to the ICP block 9 (block N), 409, rather than the user code block 7 (block N−1), 408. Thus, in the illustrated embodiment, only one block is used for storing ICP, and the address decoder chooses the correct address to let the microprocessor fetch user code or ICP code according to whether it is in ICP mode or not.

FIG. 4 shows an exemplary diagram of a portion of flash memory address space 510. It is from 0K to 72K. This address space is divided into a plurality of independently erasable blocks of flash memory. User block 0, 501, extends from address 0 to address 8K. User block 1, 502, extends from address 8K to address 16K. User block 2, 503, extends from address 16K to address 24K. User block 3, 504, extends from address 24K to address 32K. User block 4, 505, extends from address 32K to address 40K. User block 5, 506, extends from address 40K to address 48K. User block 6, 507, extends from address 48K to address 56K. User block 7, 508, extends from address 56K to address 64K. ICP block, 509, extends from address 64K to address 72K.

Again, taking an 8051 microprocessor, for example, the address space is from 0 to 64K (0000h~FFFFh). When in ICP mode, the microprocessor sends the ICP address E000h~FFFFh via data path 352 to the flash memory address decoder 356. The flash memory address decoder 356 will decode the address to 10000h 11FFFh to enable the microprocessor to access the ICP code of the ICP block 509 (block N, 290 in FIG. 2), extending from flash memory address 64K to address 72K rather than the user block 7, 508, (block N−1, 310 in FIG. 2).

FIGS. 5, 6A, and 6B are flowcharts depicting ICP erase/program/verify operations involved in an in-circuit programming process in accordance with an illustrated embodiment of the present invention. FIG. 5 presents the steps for code modify, FIG. 6A presents an erase operation, and FIG. 6B presents a program operation. FIGS. 6A and 6B are each divided into two columns. The first column, labeled "280 ICP CODE" represents the activities enacted by the ICP code 280 of FIG. 2. The second column, labeled "240 FLASH MEMORY CONTROLLER" represents the actions of the delegable flash memory controller 240 of FIG. 2.

The flowchart of FIG. 5 represents an exemplary method for in-circuit programming of an integrated circuit having a microprocessor 200 with a communication port 360 for interchanging data with an external device 390, a single flash memory device 270 of non-volatile memory cells, and a delegable flash memory controller 240 for relieving the microprocessor 200, at least partially, of in-circuit code erase/program/verify tasks to be performed in connection with the single flash memory device 270. In the illustrated embodiment, the process of in-circuit programming can be accomplished beginning at 600. An initiator input is received at step 601 from an external device 390 via the communication port 360 of the microprocessor 200. At step 602, a determination is made as to whether the initiator input pertains to or contains instructions for an ICP or a user code modification task. If the initiator input does not contain an ICP or user code modification instruction, then in the illustrated embodiment, the method branches at 603 back up to step 601 while the microprocessor continues normal operation. In this condition, the delegable flash memory controller is in the "waiting for command" or "waiting for start bit set" state which leaves the data path 340 available for use by the microprocessor 200 to execute user code or ICP code.

If the initiator input does contain an ICP or user code modification instruction, the method moves from step 602 to step 604. At step 604, the microprocessor 200 is shut down by, for example, being placed into an idle mode. In the illustrated embodiment, this is accomplished by the delegable flash memory controller 240 sending a signal by path 250 to the microprocessor 200. Through this approach, the microprocessor 200 and the delegable flash memory controller 240 are able to use the same data path 340 without conflicts. Placing the microprocessor 200 in an idle mode also serves to hold the program counter during code modification as the program counter is pushed into stack before entering the idle mode. In various embodiments, the idle mode may be invoked upon any event connected with the delegation of the modification instructions to the delegable flash memory controller 240. Also at step 604, the ICP code 280 takes control of communications with the delegable flash memory controller 240 by way of the control register 220. During code modification, the delegable flash memory controller 240 may invoke an automatic erase algorithm and/or an automatic program algorithm as will be presented in upcoming portions of the flowcharts. The delegable flash memory controller 240 communicates with the single flash memory 270 by data path 340, address path 350 (via path 354 and flash memory address decoder 356), and control paths 260 and 265 when it is performing these algorithms. A complete modification action may comprise several erase/program steps. The delegable flash memory controller 240 controls execution of these erase/program/verify steps.

At step 605, the program branches to step 606 if the ICP block 280 is to be modified or to step 614 if the ICP block is not to be modified. If the ICP block 280 is not to be modified at step 614, a routine entitled UPDATE_BLOCK is called at step 615 with its parameter=block j. Following the UPDATE_BLOCK of step 615, the operation is verified for pass or fail at step 616. If the UPDATE_BLOCK failed, an ICP fail is issued to the initiator at step 618. The operation then proceeds to end state 621. Should the UPDATE_BLOCK pass, the operation proceeds to step 617 to determine if there is another block for ICP. If there is, the operation returns to step 614. If not, the operation proceeds to step 619 for the initiator to issue a reset. At step 620, the microprocessor 200 receives a reactivation instruction, resets, and returns to normal user code operation leading to end state 621.

If the ICP block is to be modified at step 605, the program branches to step 606 to select a block for the new ICP code, in this case block i. UPDATE_BLOCK is called at step 607 with its parameter=block i. The operation is verified for pass or fail at step 608. If the UPDATE_BLOCK failed, an ICP fail is issued to the initiator, now at step 613, and the operation proceeds to the end state 621. If the UPDATE_BLOCK passed, at step 609 the operation jumps to the new ICP code at block i. UPDATE_BLOCK is again called at step 610 with parameter=block N, the location of the ICP code as in 290 of FIG. 2. Another pass/fail check is now performed at step 611. A failure leads to step 613 where an ICP fail is issued to the initiator and the operation proceeds to end state 621. A pass leads to step 612 which jumps operation to the original ICP code block N. The operation then returns to step 614 to select a block for ICP and proceeds to the end state as just described.

The flowchart of FIG. 6A presents erase operations involved in an exemplary in-circuit programming process. UPDATE_BLOCK is called by the ICP code 280 of FIG. 2 at step 700 with parameter=block k. At step 701, a write erase block k command is entered into the control register 220 of FIG. 2. At this point, the delegable flash memory controller 240 has been waiting for commands at step 750. From the control register 220, it gets the erase block k command at step 751. The delegable flash memory controller 240 then waits for a "start" signal from the ICP code 280 at step 752. This is initiated by the ICP code at step 702. The microprocessor 200 now enters idle mode at step 703 where it remains until it later receives a reactivation wake-up instruction (following step 758, infra) at step 704.

At step 753, the delegable flash memory controller 240 initiates an automatic erase algorithm to erase block k through the control path 260 and address path 350 (by way of path 354 and flash memory address decoder 356) of FIG. 2. The erase operation is validated at step 754 by the control path 260, data path 340, and address path 350 (by way of path 354 and flash memory address decoder 356) of FIG. 2. If the operation failed, step 756 determines if it has failed too many times. If the operation failed, but not too many times, the operation returns to step 753. If, however, the erase operation has failed too many times, the operation branches to step 757 where a fail is written in the control register 220 and the delegable flash memory controller 240 at step 758 sends the microprocessor 200 a reactivation instruction to wake up by path 250 at step 704 while the delegable flash memory controller 240 waits for further commands at step 759. If the erase operation passed, the operation branches to step 755 where pass is written in the control register 220. At the next step 758, the delegable flash memory controller 240 sends a reactivation instruction to wake up the microprocessor 200 by path 250 at step 704 providing an indication to the microprocessor 200 upon completion of the in-circuit programming update function that the in-circuit programming update function has been completed. The delegable flash memory controller 240 now waits for commands at step 759 which in the illustrated embodiment is continued at point B on flowchart FIG. 6B.

After sending the "start" signal to the delegable flash memory controller 240 at step 702, the ICP code 280 has not operated with the microprocessor 200 as the microprocessor 200 is in idle mode at step 703. Once the microprocessor 200 has received a wake up signal at step 704 from the delegable flash memory controller 240 by path 250, it checks the erase pass or fail state at step 705. If the erase failed, UPDATE_BLOCK fail is returned to the initiator at step 706. If the erase passed, the operation continues to point A which in the illustrated embodiment continues at point A on flowchart FIG. 6B.

FIG. 6B represents program operations involved in an in-circuit programming process. In the illustrated embodiment, following the erase operations of FIG. 6A, code modification may continue with the programming steps of FIG. 6B at points A and B. Point A designates activities enacted by the ICP code 280 of FIG. 2 as it is in the left column of the flowchart. The right or second column, labeled "240 FLASH MEMORY CONTROLLER," represents actions of the delegable flash memory controller 240 of FIG. 2. and in the illustrated embodiment proceeds from point B. Although the illustrated embodiment of FIG. 6B is shown continuing from FIG. 6A, other embodiments may exist wherein program flow continues from other functions or steps.

Once the ICP code 280 has checked that the erase passed, operation continues at step 707 where the ICP code 280 obtains one or more bytes of data from the ICP initiator. The ICP code 280 then causes writing of the program address/data command to the delegable flash memory controller 240 via the control register 220 at step 708. The delegable flash memory controller 240 receives the program address/data command at step 760, and then waits for a "start" signal from the ICP code 280 at step 761. After the ICP code 280 has written the program address/data, it writes a "start" bit in the control register 220 at step 709 and the microprocessor 200 enters idle mode at step 710. Once the "'start" bit has been written in the control register 220, the delegable flash memory controller 240 programs block k via control path 260, address path 350 (through path 354 and the flash memory address decoder 356), and data path 340 at step 762 by initiating an automatic program algorithm.

After the delegable flash memory controller 240 has programmed block k, the program operation is verified at step 763 by control path 260, address path 350 (again through path 354 and the flash memory address decoder 356), and data path 340. If the verify fails, operation branches to step 765.

At step 765, if the operation has failed too many times, operation is branched to step 766 where a fail indication is written into the control register 220. A reactivation instruction is then sent to wake up the microprocessor 200 by path 250 at step 767, and the delegable flash memory controller 240 proceeds to step 768 to wait for commands. Once the microprocessor 200 has received the wake up signal from the delegable flash memory controller 240 at step 711, the ICP code 280 proceeds to step 712 to check whether the program operation has passed or failed. If the programming has failed as is the case in this flowchart branch, the ICP code 280 returns UPDATE_BLOCK fail to the initiator at step 713.

If on the other hand the program operation has not failed too many times, the operation returns to step 762 to reprogram block k. If the program verify passes at step 763, the operation continues to step 764 where pass is written in the control register 220. A reactivation instruction is then sent to wake up the microprocessor 200 by path 250 at step 767 providing an indication to the microprocessor 200 upon completion of the in-circuit programming update function that the in-circuit programming update function has been completed, and the delegable flash memory controller 240 proceeds to step 768 to wait for commands.

In this case, once the microprocessor 200 has received the wake up signal from the delegable flash memory controller 240 at step 711, the ICP code 280 proceeds to step 712 to check whether the program operation has passed or failed. If the programming failed, as described above, the ICP code 280 returns UPDATE_BLOCK fail to the initiator at step 713. If the programming passed, as in this instance, the ICP code 280 branches to step 714 wherein a determination is made as to whether there are more bytes to program. If there are more bytes to program, the ICP code 280 returns to point A, prior to step 707. If there are no more bytes to program, the ICP code 280 branches to step 715 and returns UPDATE_BLOCK pass to the initiator.

It will be understood by those skilled in the art that the structures and method steps of the invention described in the foregoing preferred embodiments facilitate the implementation of an ICP integrated circuit. The embodiments are provided as examples of the invention described herein, and the invention is not limited to these examples. Multiple variations and modifications of the disclosed embodiments will occur, to the extent not mutually exclusive, to those skilled in the art upon consideration of the foregoing disclosure. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. An apparatus for in-circuit programming of an integrated circuit, comprising:
   a single non-volatile memory device comprising non-volatile memory cells on the integrated circuit that store instructions for execution by a microprocessor, the single non-volatile memory device containing in-circuit programming code for programming the single non-volatile memory device and user code for facilitating communication with an external device, wherein the in-circuit programming code can be reprogrammable and stored in a predetermined location of the single non-volatile memory device, and the user code can be stored in a location of the single non-volatile memory device that is different from the predetermined location;
   a microprocessor configured to input instruction addresses to the single non-volatile memory device and to receive instructions from the single non-volatile memory device; and
   a delegable memory controller operatively coupled between the microprocessor and the single non-volatile memory device, the delegable memory controller being configured to receive an in-circuit program update command and to perform an in-circuit programming update function on the non-volatile memory cells of the single non-volatile memory device, whereby the microprocessor is relieved of performing the in-circuit programming update function;
   wherein the single non-volatile memory device, the microprocessor, and the delegable memory controller are on a same single chip;
   wherein the microprocessor is configured to enter an idle mode while the delegable memory controller performs the in-circuit programming update function, thereby avoiding input/output ports conflict.

2. The apparatus as set forth in claim 1, wherein the non-volatile memory cells in the single non-volatile memory device comprise electrically erasable programmable read only memory cells.

3. The apparatus as set forth in claim 1, wherein:
   the apparatus further comprises a control register;
   the single non-volatile memory device comprises a single flash memory device;
   the delegable memory controller comprises a delegable flash memory controller coupled between the control register and the single flash memory device; and
   the delegable memory controller comprises a flash memory address decoder operatively coupled to the delegable flash memory controller, the microprocessor, and the single flash memory device.

4. The apparatus as set forth in claim 1, wherein the single non-volatile memory device comprises a plurality of separately erasable blocks of the non-volatile memory cells, and the in-circuit programming code is stored in the predetermined location of a particular block or group of blocks in the plurality of separately erasable blocks of the non-volatile memory cells.

5. The apparatus as set forth in claim 1, in which the in-circuit programming code and the user code in the single non-volatile memory device share high voltage pumping, sense amplifier, and input/output port structure.

6. The apparatus as set forth in claim 1, wherein the delegable memory controller is configured to perform the in-circuit programming update function to erase and then program at least a portion of the non-volatile memory cells of the single non-volatile memory device, wherein the update function occurs in real time either after deployment of the integrated circuit, or occurs in a factory where the integrated circuit is initially manufactured.

7. The apparatus as set forth in claim 1, wherein the non-volatile memory cells in the single non-volatile memory device comprise floating gate memory cells.

8. The apparatus as set forth in claim 1, wherein the delegable memory controller issues a reactivation instruction to the microprocessor upon completion of the in-circuit programming update function.

9. The apparatus as set forth in claim 1, in which the in-circuit programming code and the user code in the single non-volatile memory device share high voltage pumping circuitry, sense amplifiers, and input/output ports.

10. The apparatus as set forth in claim 1, wherein the in-circuit programming code and the user code are contained in the single non-volatile memory device, and are updated by the delegable memory controller without further memory device.

11. An apparatus for in-circuit programming of an integrated circuit, comprising:
a microprocessor configured to execute a sequence of instructions;
communication means for transmitting digital data to and receiving digital data from an external device;
a single non-volatile memory device comprising non-volatile memory cells on the integrated circuit that store instructions for execution by the microprocessor, the single non-volatile memory device containing in-circuit programming code for programming the single non-volatile memory device and user code for facilitating communication with the external device, wherein the in-circuit programming code can be reprogrammable and stored in a predetermined location of the single non-volatile memory device, and the user code can be stored in a location of the single non-volatile memory device that is different from the predetermined location; and
memory controlling means for performing an in-circuit programming update function in lieu of the microprocessor performing the in-circuit programming update function, upon the memory controlling means being enabled by the microprocessor to perform the in-circuit programming update function;
wherein the microprocessor, the communication means, the single non-volatile memory device, and the memory controlling means are on a same single chip;
wherein the memory controlling means comprises a function of issuing an idle command to the microprocessor before performing the in-circuit programming update function.

12. The apparatus as set forth in claim 11, wherein the memory controlling means comprises control logic which is configured to notify the microprocessor when the in-circuit programming update function is completed.

13. The apparatus as set forth in claim 11, wherein the memory controlling means further comprises a function of providing an indication to the microprocessor upon completion of the in-circuit programming update function that the in-circuit programming update function has been completed.

14. The apparatus as set forth in claim 11, wherein:
the single non-volatile memory device comprises a flash memory device; and
the memory controlling means comprises a delegable flash memory controller, a control register, and a flash memory address decoder.

15. The apparatus as set forth in claim 11, wherein:
the single non-volatile memory device comprises a plurality of separately erasable blocks of the non-volatile memory cells, and
the in-circuit programming code is stored in a predetermined block or group of blocks in the plurality of separately erasable blocks; and the in-circuit programming code and the user code in the single non-volatile memory device share high voltage pumping, sense amplifier, and input/output port structures.

16. The apparatus as set forth in claim 11, wherein the in-circuit programming code and the user code are contained in the single non-volatile memory device, and are updated by the memory controlling means without further memory device.

17. A method for in-circuit programming of an integrated circuit, comprising:
receiving an in-circuit program or user code modification instruction from an initiator disposed externally to the integrated circuit to a microprocessor on the integrated circuit;
forwarding the modification instruction through the microprocessor to a delegable memory controller;
performing a function of code updating wherein code contained within a single non-volatile memory device is programmed with data from the initiator under control of the delegable memory controller, the code within the single non-volatile memory device comprises an in-circuit programming code and a user code, the in-circuit programming code can be reprogrammable and stored in a predetermined location of the single non-volatile memory device, and the user code can be stored in a location of the single non-volatile memory device that is different from the predetermined location; and
accessing at least a portion of the updated code with the microprocessor;
wherein the single non-volatile memory device, the microprocessor, and the delegable memory controller are formed on a same single chip;
wherein the step of forwarding the modification instruction through the microprocessor includes the microprocessor entering an idle mode, thereby avoiding input/output ports conflict.

18. The method as set forth in claim 17, wherein performance of the function of code updating is preceded by the microprocessor delegating the function of code updating to the delegable memory controller.

19. The method as set forth in claim 17, wherein the forwarding of the modification instruction through the microprocessor is followed by the microprocessor entering an idle mode.

20. The method as set forth in claim 17, wherein:
the single non-volatile memory device comprises a flash memory;
the delegable memory controller comprises a delegable flash memory controller; and
following the code updating under the control of the delegable flash memory controller sends a completion acknowledgement to the microprocessor thereby signaling the microprocessor to exit an idle mode.

21. The method as set forth in claim 17, wherein:
the in-circuit programming code and the user code are arranged in a plurality of blocks of non-volatile memory cells of the single non-volatile memory device;
the in-circuit programming code is stored in a particular block or group of blocks in the plurality of blocks of the single non-volatile memory device, and
the code updating includes modifying the particular block or group of blocks of the single non-volatile memory device with at least one block of new in-circuit programming code or new user code.

22. The method as set forth in claim 21, wherein:
the integrated circuit includes at least one port to facilitate communication with the initiator;

the code updating includes exchanging data through the at least one port; and the in-circuit programming code and the user code within the single non-volatile memory device share high voltage pumping, sense amplifier, and input/output port structures.

23. The method as set forth in claim 17, wherein:

the in-circuit programming code and the user code within the single non-volatile memory device share high voltage pumping, sense amplifier, and input/output port structures.

24. The method as set forth in claim 23, wherein the code updating is preceded by the microprocessor delegating the function of code updating to the delegable memory controller.

25. The method as set forth in claim 17, wherein:

the single non-volatile memory device comprises a single flash memory device;

the delegable memory controller comprises a delegable flash memory controller; and following the step of code updating the delegable flash memory controller sends a reactivation instruction to the microprocessor signaling completion of the code updating.

26. The method as set forth in claim 17, wherein the in-circuit programming code and the user code are contained in the single non-volatile memory device, and are updated by the delegable memory controller without further memory device.

* * * * *